CONTROLLABLE SCHOTTKY DIODE

Filed Dec. 28, 1966 2 Sheets-Sheet 1

Inventor:
Reinhard Dahlberg
By: Spencer & Kaye
Attorneys

Inventor:
Reinhard Dahlberg
By: Spencer & Kaye
Attorneys

United States Patent Office 3,495,141

Patented Feb. 10, 1970

3,495,141
CONTROLLABLE SCHOTTKY DIODE

Reinhard Dahlberg, Heilbronn-Bockingen, Germany, assignor to Telefunken Patentverwertungsgesellschaft m.b.H., Ulm (Danube), Germany Filed Dec. 28, 1966, Ser. No. 605,340
Claims priority, application Germany, Dec. 30, 1965, T 30,180
Int. Cl. H01l *11/00, 15/00*
U.S. Cl. 317—235 15 Claims

ABSTRACT OF THE DISCLOSURE

A Peltier element is combined with a Schottky diode to modulate current flow through the diode by heat injection of electrons from the Peltier element. A Schottky diode is, as it is known, a semiconductor diode which has instead of a pn-junction a rectifying metal-semiconductor junction. The combined semiconductor device includes a thin layer of metallic material applied to a semiconductor body to form a Schottky-type junction and a layer of thermoelectric material applied to the metallic material to form a Peltier element in which the metallic material of the Schottky diode comprises one leg of the Peltier element, and the thermoelectric material comprises the other leg. A control voltage is applied across the Peltier element to cause electrons which are not in thermal equilibrium with their environment to be injected into and through the layer of metallic material to modulate the current flow through the Schottky-type junction.

Background of the invention

In conventional semiconductor systems, such as transistors, the current is transported by the minority charge carriers. Such semiconductor elements have certain drawbacks. For example, the elements have to be made of monocrystals; also, the elements are sensitive to radiation. These drawbacks can be avoided if semiconductor elements are used in which the current is transported not by the minority charge carriers but by the majority charge carriers, and it is, therefore, the primary object of the present invention to provide a controllable semiconductor element which operates with majority charge carriers.

Summary of the invention

The present invention provides a controllable Schottky diode which is controlled by majority charge carriers injected into the junction of the Schottky diode by a Peltier element. The Schottky diode and Peltier element comprise a unitary structure in which one leg portion of the Peltier element is applied as a metallic layer to a semiconductor body and forms a Schottky-type junction therewith, and in which the second leg portion of the Peltier element is applied as a nonrectifying contact to the metallic layer of the Schottky diode so that when a control voltage is applied across the Peltier element, electrons which are not in thermal equilibrium with their environment are heat-injected into and through the metallic layer of the Schottky diode to modulate the current through the junction thereof. In the semiconductor body, the heat-injected electrons are drawn off by a collector electrode attached to the semiconductor body on the other side of the junction.

The Schottky diode may be biased either in the reverse direction or in the forward direction. When it is biased in the reverse direction, the bias voltage is selected to be lower than the breakdown voltage of the Schottky diode, and when it is biased in the forward direction, the bias voltage is selected to be lower than the gate voltage of the Schottky diode. By gate voltage is means that voltage. which when applied across the junction causes the opening of an electrical gate, that is, which changes the element from the blocking to the conductive state. The bias voltage applied across the Schottky diode portion of the invention is generally chosen to be greater than the control voltage applied across the Peltier element. The bias voltage is applied between the leg portion of the Peltier element which is formed by the metallic layer and a collector electrode which is attached to the semiconductor body on the other side of the junction. The control voltage is applied across the two leg portions of the Peltier element and is preferably smaller than double the Peltier voltage of the Peltier element.

Description of the preferred embodiments

The metallic layer of the Schottky diode may consist of metal or of a highly doped polycrystalline semiconductor material. As is well known such highly doped materials have electrical conductivity properties similar to metals. The thickness of this layer is preferably smaller, or at most equal to $10^4$ angstroms. The material of the metallic layer is chosen from the group of materials in which the free path length of the electrons with respect to the phonons of the material is as large as possible. This free path length should preferably be greater than the free path length of the electrons with respect to each other. Suitable materials are, example, copper, nickel or gold. The contact layer itself must be as thin as possible.

Figure 1:
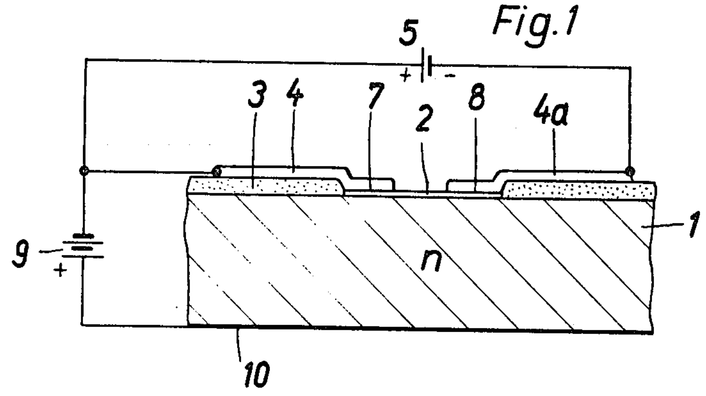
FIGURE 1 is an enlarged cross-sectional view of one embodiment of the invention.

In the embodiment shown in FIGURE 1, the Schottky diode consists of a semiconductor body 1 having N-type conductivity and a metallic layer 2 which forms a Schottky-type junction with semiconductor body 1. The metallic layer 2 is contained in an opening formed in an insulating layer 3 provided on the semiconductor body 1. The insulating layer 3 may be an oxide layer, for example.

The Peltier element is formed by metallic layer 2 of the Schottky diode, which comprises the first leg portion of the Peltier element, and by a second leg portion comprising layers 4 and 4*a* of thermoelectric material applied to the metallic layer 2 and to the insulating layer 3. The layers of thermoelectric material make contact with metallic layer 3 at nonrectifying contacts 7 and 8. The thermoelectric layers 4 and 4*a* are vapor-deposited, for example, in a high vacuum, or are made by cathode evaporation. They may consist of a material, such as antimony, bismuth telluride, n-germanium, or the like. In this case, for instance, the material is thermoelectrically of the N-type with respect to the material of the metallic layer 2 of the Schottky diode. The metallic layer 2 of the Schottky diode thus represents the thermoelectric p-leg portion of the Peltier element.

When a voltage is applied to the thermoelectric element between the layer 4 and the layer 4*a* from voltage source 5, one of the two thermoelectric contacts 7 and 8 will inject electrons which are not in thermal equilibrium with their environment independently of the polarity of the voltage. The injected electrons travel through the metallic layer 2 of the Schottky diode into the n-type semiconductor body 1 if the metallic layer 2 of the Schottky diode is sufficiently thin. In this embodiment, the Schottky diode is biased in the reverse direction by a voltage source 9 which is applied across thermoelectric layer 4 and a collector electrode 10 which is attached to the semiconductor body 1 on the side thereof opposite the metallic layer 2. The electrons which are injected into semiconductor body 1 from the thermoelectric contact 7 or 8 are drawn off by the collector electrode 10.

Figure 2:
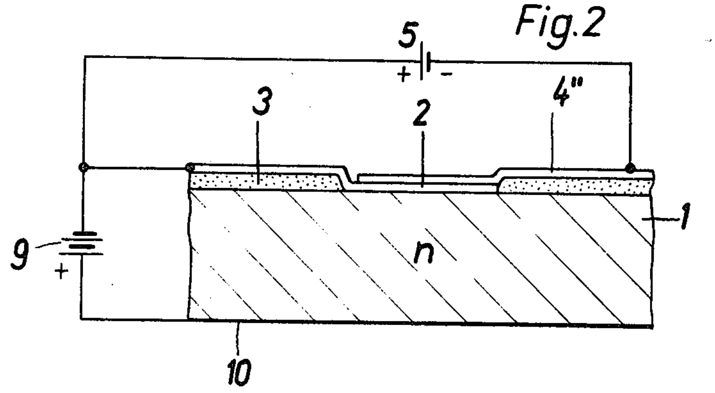
FIGURE 2 is an enlarged cross-sectional view of another embodiment of the invention.

FIGURE 2 shows a second embodiment in which the second thermoleg does not consist, as in FIGURE 1, of two identical thermoelectric layers (4 and 4*a*) but only of one thermoelectric layer 4''. The control voltage furnished by the voltage source 5 is applied, in this case, across metallic layer 2 and thermoelectric layer 4''.

Figure 3:
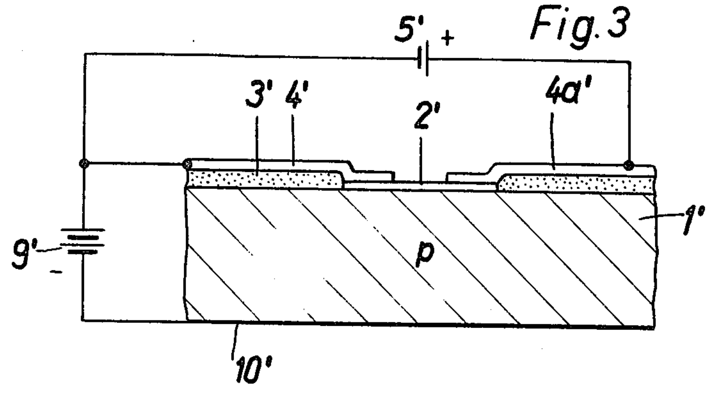
FIGURE 3 is an enlarged cross-sectional view of a third embodiment of the invention.

FIGURE 3 shows an embodiment analogous to that shown in FIGURE 1 wherein a p-type semiconductor body 1' is provided as base body instead of an n-type semiconductor body. Applied to the metallic layer 2' of this Schottky diode are two thermoelectric layers 4' and 4*a'* which form the N-leg portion of a thermoelectric element whose P-leg portion is the metallic layer 2' of the Schottky diode. In the embodiment of FIGURE 3, the Schottky diode is biased in the reverse direction by a voltage source 9', since a positive potential is present at the thermoelectric layer 4' and a negative potential is present at the collector electrode 10' contacting the p-type semiconductor body 1'.

The embodiment shown in FIGURE 3 is analogous in its operation to the embodiment shown in FIGURE 1 except for the indicated reversals of polarity.

The controllable Schottky diode of this invention may be employed, for example, as an active four-terminal network in integrated circuits. It may also be used as an amplifier in microwave circuits.

The controllable Schottky diode of this invention acts as an active four-terminal network when the product of the voltage across the Schottky diode and the injected current is greater than the product of the control voltage applied to the Peltier element and the Peltier current being produced by this voltage.

Figure 4:
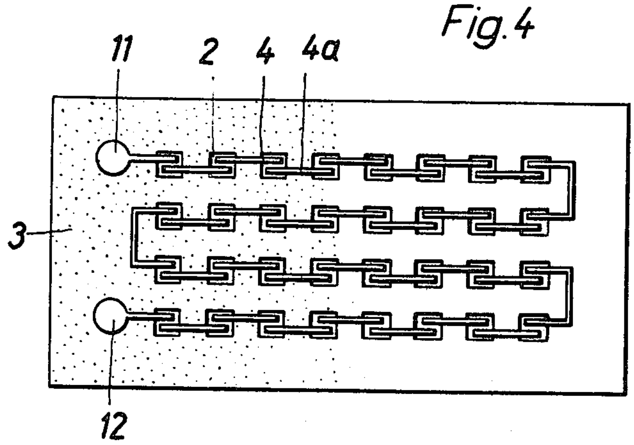
FIGURE 4 is a plan view of a plural embodiment of the invention containing a plurality of individual elements, such as disclosed in FIGURES 1 and 3.

FIGURE 4 illustrates a plural embodiment of the invention which contains, for example, 32 of the individual elements shown in FIGURE 1. The metallic layers 2 of the individual Schottky diodes are visible in the recesses of the oxide layer 3 applied to a common semiconductor body upon which the metallic layers 2 are applied. Thermoelectric layers 4 and 4*a* are deposited on corresponding layers 2. The leg portions of all Peltier elements are electrically connected in series, and the Schottky diodes are connected in parallel with respect to each other due to the common semiconductor body. Nonretifying contacts 11 and 12 are provided at each end of the series-connected Peltier elements. This embodiment has the advantage that the input voltage thereof may be as high as the voltage applied to one individual Peltier element multiplied by the number of Peltier elements in the device.

Figure 5:
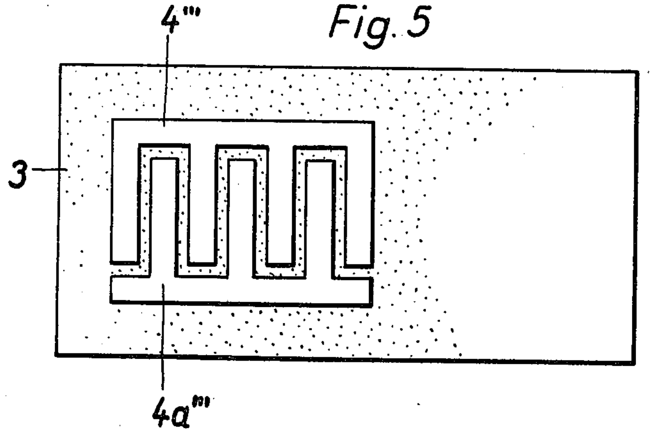
FIGURE 5 is a plan view of a further embodiment of the invention utilizing an intermeshed comb-like structure for one leg of the Peltier element.

FIGURE 5 illustrates another embodiment of the present invention in which the thermoelectric layers 4''' and 4*a'''* have a comb-like structure and are intermeshed in a comb-like fashion. Such an arrangement is recommended for higher outputs.

Although many different materials can be used in the construction of the above-described embodiments of the invention, the following examples indicate materials which were found to be particularly suitable in the embodiments shown in FIGURES 1 and 3.

EXAMPLE 1

In the embodiment shown in FIGURE 1, the semiconductor body 1 is made of Si, the metallic layer 2 is made of palladium and the thermoelectric layers 4 and 4*a* are made of ZnSb. The metallic layer 2 is vapor-deposited on semiconductor body 1 in a high vacuum and has a thickness of .01$\mu$. The thermoelectric layers 4 and 4*a* are also vapor-deposited on semiconductor body 1 in a high vacuum and have a thickness of 2$\mu$. Thermoelectric layers 4 and 4*a* are .01 mm. in width and spaced .005 mm. apart. The voltage of voltage source 9 is approximately 10 volts, and the voltage of voltage source 5 is approximately .2 volt.

EXAMPLE 2

In the embodiment shown in FIGURE 3, the semiconductor body 1' is made of Si, the metallic layer 2' is made of gold, and the thermoelectric layers 4' and 4*a'* are made of TiN. The metallic layer 2' is cathode-evaporated on semiconductor body 1' and has a thickness of .01$\mu$. The thermoelectric layers 4' and 4*a'* are also cathode-evaporated on semiconductor body 1' and have a thickness of 1$\mu$. Thermoelectric layers 4' and 4*a'* are .005 mm. in width and spaced .001 mm. apart. The voltage of voltage source 9' is approximately 5 volts, and the voltage of voltage source 5 is approximately .2 volt.

It will be understood that the above description of the present invention is susceptible to various modifications, changes, and adaptations.

I claim:

1. A controllable Schottky diode, comprising, in combination:

(a) a semiconductor body;

(b) a layer of material having electrical characteristics similar to a metal attached to one surface of said semiconductor body and forming a Schottky-type junction therewith;

(c) a layer of thermoelectric material attached to one surface of said layer of metallic material, which is in nonrectifying contact with said metallic layer, said thermoelectric material having the opposite thermoelectric type of said metallic material and forming a Peltier element in combination therewith, said metallic material comprising one leg of said Peltier element and said thermoelectric material comprising the other leg thereof;

whereby the application of a voltage across said two legs causes carriers which are not in thermal equilibrium with their environment to be injected into and through said layer of metallic material for modulating the current flow through said Schottky-type junction.

2. A controllable Schottky diode as defined in claim 1, wherein said layer of metallic material is of the thermoelectric p-type with respect to said layer of thermoelectric material.

3. A controllable Schottky diode as defined in claim 1, wherein said other leg portion of said Peltier element comprises two layers of said thermoelectric material attached to said layer of metallic material at spaced-apart locations.

4. A controllable Schottky diode as defined in claim 1 and further comprising means for applying a reverse bias voltage across said Schottky-type junction.

5. A controllable Schottky diode as defined in claim 4, wherein said reverse bias voltage applied across said Schottky-type junction is smaller than or equal to the breakdown voltage thereof.

6. A controllable Schottky diode as defined in claim 1 and further comprising means for applying a voltage across said two legs, said voltage being smaller than double the Peltier voltage of said Peltier element.

7. A controllable Schottky diode as defined in claim 1 and further comprising means for applying a forward bias voltage across said two legs, said forward bias voltage being smaller than the gate voltage of said Schottky diode.

8. A controllable Schottky diode as defined in claim 1, wherein said layer of metallic material comprises a layer of metal or of highly doped polycrystalline semiconductor material.

9. A controllable Schottky diode as defined in claim 1, wherein said layer of metallic material comprises a material in which the free path length of the electrons with respect to the phonons thereof is greater than the free path length of the electrons with respect to each other.

10. A controllable Schottky diode as defined in claim 1, wherein said layer of metallic material is chosen from the group consisting of copper, nickel, and gold.

11. A controllable Schottky diode as defined in claim 1, wherein said layer of metallic material has a thickness which is smaller than or at most equal to $10^4$ angstroms.

12. A controllable Schottky diode as defined in claim 1 and further comprising a layer of insulating material attached to said one surface of said semiconductor body, an opening formed in said layer of insulating material, said metallic layer being attached to said semiconductor body within said opening, and said layer of thermoelectric material being attached to said metallic layer and extending transversely across said layer of insulating material.

13. A controllable Schottky diode as defined in claim 3, wherein said two layers of thermoelectric material are comb-like in shape with the teeth of one layer being intermeshed with the teeth of the other layer.

14. A multiple controllable Schottky diode comprising a plurality of diodes as defined in claim 1, wherein the individual Schottky diodes are connected together in parallel and the leg portions of the Peltier elements thereof are connected together in series.

15. A controllable Schottky diode as defined in claim 4 in which said means for applying a reverse bias voltage is applied across one leg of the Peltier element and a collector element attached to the semiconductor body.

References Cited

UNITED STATES PATENTS

| | | | |
|---|---|---|---|
| 2,975,638 | 3/1961 | Morrison | 136—203 |
| 3,121,809 | 2/1964 | Atalla | 317—234 |
| 3,290,127 | 12/1966 | Kahng et al. | 317—234 |

JERRY D. CRAIG, Primary Examiner

U.S. Cl. X.R.

136—203; 307—299